(12) United States Patent
Kalyanasundharam et al.

(10) Patent No.: US 6,542,423 B1
(45) Date of Patent: Apr. 1, 2003

(54) READ PORT DESIGN AND METHOD FOR REGISTER ARRAY

(75) Inventors: Vydhyanathan Kalyanasundharam, San Jose, CA (US); Ajay Naini, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/955,619

(22) Filed: Sep. 18, 2001

(51) Int. Cl.$^7$ ................................................. G11C 7/00
(52) U.S. Cl. ...................................... 365/203; 365/154
(58) Field of Search ................................ 365/203, 154, 365/204, 189.11, 189.12

(56) References Cited

U.S. PATENT DOCUMENTS

| | | | | |
|---|---|---|---|---|
| 5,477,489 A | * | 12/1995 | Wiedmann | .................. 365/154 |
| 5,828,610 A | * | 10/1998 | Rogers et al. | ......... 365/189.02 |
| 6,430,099 B1 | * | 8/2002 | Rogenmoser et al. | .. 365/189.04 |

* cited by examiner

*Primary Examiner*—Michael S. Lebentritt
*Assistant Examiner*—Anh Phung
(74) *Attorney, Agent, or Firm*—Fenwick & West LLP

(57) ABSTRACT

A register array system including a first number of rows by a second number of columns of data registers, a read line, a read bit line, and a single pull down device corresponding to each data register in each column of data registers and configured to discharge, in response to being turned on, the read bit line corresponding to the column of data registers. The pull down device corresponding to a data register is only turned in response to a clock signal, a read enable signal, and the data stored in the data register each having a high value. Therefore, the capacitance associated with the read bit line corresponding to a column of data registers stays at the same capacitance value during the precharging phase and during a multi-hot condition. The problem of voltage droop caused by charging sharing in a multi-hot condition is thus eliminated.

11 Claims, 6 Drawing Sheets

| # | Clk | REN[0] | REN[m-1] | wln[0] | wln[m-1] | rd_data[0] | bl[0] | DATA{0,0} | DATA{0,m-1} |
|---|---|---|---|---|---|---|---|---|---|
| 1 | 0 | X | X | 0 | 0 | 0 | 1 | X | X |
| 2 | 1 | 1 | 0 | 1 | 0 | 0 | 1 | 0 | X |
| 3 | 1 | 1 | 0 | 1 | 0 | 1 | 0 | 1 | X |
| 4 | 1 | 1 | 1 | 1 | 1 | 1 | 0 | 1 | X |
| 5 | 1 | 1 | 1 | 1 | 1 | 1 | 0 | X | 1 |
| 6 | 1 | 1 | 1 | 1 | 1 | 0 | 1 | 0 | 0 |

Evaluate and Precharge

| # | Clk | REN[0] / REN[m-1] | wln[0] / wln[m-1] | DATA{0,0} / DATA{0,m-1} | wev1[0] / wev1[m-1] | bln[0] | rd_data[0] |
|---|---|---|---|---|---|---|---|
| 1 | 0 | X / X | 1 / 1 | X / X | 0 / 0 | 1 | 0 |
| 2 | 1 | 1 / 0 | 0 / 1 | 0 / X | 0 / 0 | 1 | 0 |
| 3 | 1 | 1 / 0 | 0 / 1 | 1 / X | 1 / 0 | 0 | 1 |
| 4 | 1 | 1 / 1 | 0 / 0 | 1 / 1 | 1 / 1 | 0 | 1 |
| 5 | 1 | 1 / 1 | 0 / 0 | 0 / 1 | 1 / 0 | 1 | 0 |
| 6 | 1 | 1 / 1 | 0 / 0 | 0 / 1 | 0 / 1 | 1 | 0 |
| 7 | 1 | 1 / 1 | 0 / 0 | 0 / 0 | 0 / 0 | 1 | 0 |

FIG. 4

READ PORT DESIGN AND METHOD FOR REGISTER ARRAY

FIELD OF THE INVENTION

The present invention is related to the design of register arrays and a system that implements the design.

BACKGROUND OF THE INVENTION

FIG. 1 is block diagram of a conventional register array system 100 comprising m read enable ports 110 (where m is a positive number), m NAND gates 120, m input inverters 130, n output inverter 150 (where n is another positive number), and an array of m×n data registers DATA {0,0}, ... DATA{0, n−1}, ..., DATA {m−1,0}, ..., and DATA {m−1, n−1}, each DATA register for storing a data value. The register array 100 further comprises m read word lines, wln[0], wln[1], ..., and wln[n], and n read bit lines, bl[0], bl[1], ..., and bl[n], interconnecting the m×n data registers. Each read word line is coupled to an output of one of the m NAND gates 120 through one of the m input inverters 150. Each NAND gate receives as its inputs a clock signal CLK and an input signal from one of the m input ports 110. The read bit lines are read through the output inverters 130.

In the register array 100, each data register, such as DATA {i,j}, where i=0, 1, ..., m and j=0, 1, ..., n, is coupled to a corresponding pair of read word line wln[i] and read bit line bl[j] by a stack of two N-type field-effect transistors (NFET) $N_1$ and $N_2$. The gate voltage of the NFET $N_1$ is regulated by the corresponding read word line, while the gate voltage of the NFET $N_2$ is regulated by the data value stored in the data register. The first diffusion region of the transistor N1 is coupled to the corresponding bit line, while the drain of the transistor N1 is coupled to the first diffusion region of the transistor N2, which drain is coupled to a low voltage $V_{SS}$, or the ground.

FIG. 2A is a plot of the CLK signal and FIG. 2B is a truth table for the conventional register array 100. When the clock signal CLK is low, the read bit lines are precharged through a precharging circuit (not shown in FIG. 1). During a pre-charge phase, the read bit lines bl[0], ..., and bl[n] are charged to a voltage $V_{DD}$. In the conventional register array system 100, each read bit line bl[j], where j=0, 1, ..., n, has an associated capacitance, $C_1$. This capacitance includes the diffusion capacitance of NFET N1, from 0 to m−1 rows and the wire capacitance of the read bit line which connects to all of the NFETs and to the output inventors, and also includes the input gate capacitance of the output mxerta. There is thus a quantity of charge, $Q=C_1 V_{DD}$, associated with precharging the read bit line.

When the CLK is high, the register array is read or evaluated. During a normal functional mode of operation, a read-enable signal REN[i], where i=0, 1, ..., m, is raised and supplied to an input port 110 to select the data registers along one of the m read word lines. A NAND gate 120 and input inverter 130 pair receives the read enable signal and the CLK signal to turn on the transistors $N_1$ on the read word line. With transistors $N_1$ on the read word line being turned on, each read bit line is directly coupled to the first diffusion region of the corresponding NFET $N_2$ on the read word line. The read bit line will remain charged at $V_{DD}$ or discharge to $V_{SS}$, depending on whether the corresponding NFET N2 is turned on by the data value in the corresponding data register. Therefore, the output of the read bit line, which is read through an inverter 150, reflects the stored data of the corresponding data register.

During the normal functional mode of operation, only one of the read enable signals REN[i] is raised such that content associated with only one read word line is selected. However, as shown in FIG. 1, during a scan test mode, a scan input Si, typically comprising a random pattern, is input into the input ports 110 and a scan output So is read. The scan out So is connected to scan input ports of a succeeding block of circuitry. With a random pattern scan input Si in the scan test mode, more than one read word lines may be selected, i.e., multiple data registers along a bit line may be read, leading to a multiple-hot condition, as explained in more detail below.

If a data register has a logical value of zero, the corresponding NFET $N_2$ is turned off. In this case, if the corresponding read word line is selected, i.e., the corresponding NFET $N_1$ is turned on, and the corresponding read bit line is coupled to an equivalent diffusion capacitance of the NFET $N_2$, which can be modeled as a capacitance $C_2$. This diffusion capacitance $C_2$ is thus coupled in parallel with the capacitance $C_1$ of the pre-charged read bit line. The charge Q will then be shared by capacitance $C_2$ and capacitance $C_1$. Consequently, the voltage of the read bit line will droop below $V_{DD}$. However, since $C_1$ typically has a capacitance value much greater than $C_2$, the voltage droop caused by a single $C_2$ is sufficiently small that the voltage on the read bit line will remain high enough for the output of the read bit line to reflect the stored data of the data register being read.

However, during a test mode, there can be a multi-hot condition, i.e., two or more read word lines may be selected. If more than one data registers along a read bit line have a value of zero, several diffusion capacitances C2 will be coupled to the read bit line. The charge Q initially placed on the read bit line during the precharge phase will be shared by $C_1$ and multiple $C_2$'s, significantly lowering the read bit line voltage. The final voltage $V_{final}$ on the read bit line for a multi-hot condition with each corresponding data register having a value of zero can be calculated as:

$$V_{final} = \frac{V_{DD} \cdot C_1}{C_1 + x \cdot C_2},$$

where x is the number of transistors $N_1$ turned on. If the voltage droop is severe enough, an erroneous result may occur.

The voltage droop caused by a multi-hot condition is especially serious in a low-voltage system in which Vdd is low, since even a comparatively small percentage drop in Vdd may reduce the voltage to below the threshold level of an output inverter 150.

Therefore, there is a need for a technique to reduce the effect of charge sharing in a register array during a multi-hot condition.

SUMMARY OF THE INVENTION

The present invention provides a register array system and a method for reading the register array system that essentially eliminate the problem of charge sharing in a multi-hot condition.

In one embodiment of the present invention, the register array system comprises a first number of rows by a second number of columns of data registers, a read word line corresponding to each row of data registers, a read bit line corresponding to each column of data registers, and a pull down device corresponding to each data register in each column of data registers and configured to discharge, in response to being turned on, the read bit line corresponding to the column of data registers. The register array system further comprises a first logic device corresponding to each row of data registers, receiving as inputs a clock signal and a read enable signal for the row of data registers, and having an output connected to the read word line corresponding to the same row of data registers. The register array system further comprises a second logic device corresponding to each data register in each row of data registers, and having a first input coupled to the data register and a second input connected to the read word line corresponding the row of data registers. The second logic device corresponding to a data register produces an output that turns on or off the pull down device corresponding to the same data register.

In one embodiment of the present invention, the first logic device corresponding to a row of data registers and the second logic device corresponding to one data register in the row of data registers are configured so that the pull down device corresponding to the one data register is only turned on by the output of the second logic device in response to the clock signal, the read enable signal for the row of data registers, and the data stored in the one data register each having a high value. Otherwise, the pull down device corresponding to the one data register remains turned off.

Therefore, the capacitance associated with the read bit line corresponding to a column of data registers stays at the same capacitance value during the precharging phase (when the clock signal has a low value) and during a multi-hot condition (when a selected group of data registers in the column of data registers are storing a low data value). The problem of voltage droop caused by charging sharing in a multi-hot condition is thus eliminated.

BRIEF DESCRIPTION OF THE DRAWINGS

FIG. 4 is a truth table for the register array of FIG. 4.

DETAILED DESCRIPTION OF THE PREFERRED EMBODIMENTS

Figure 1:
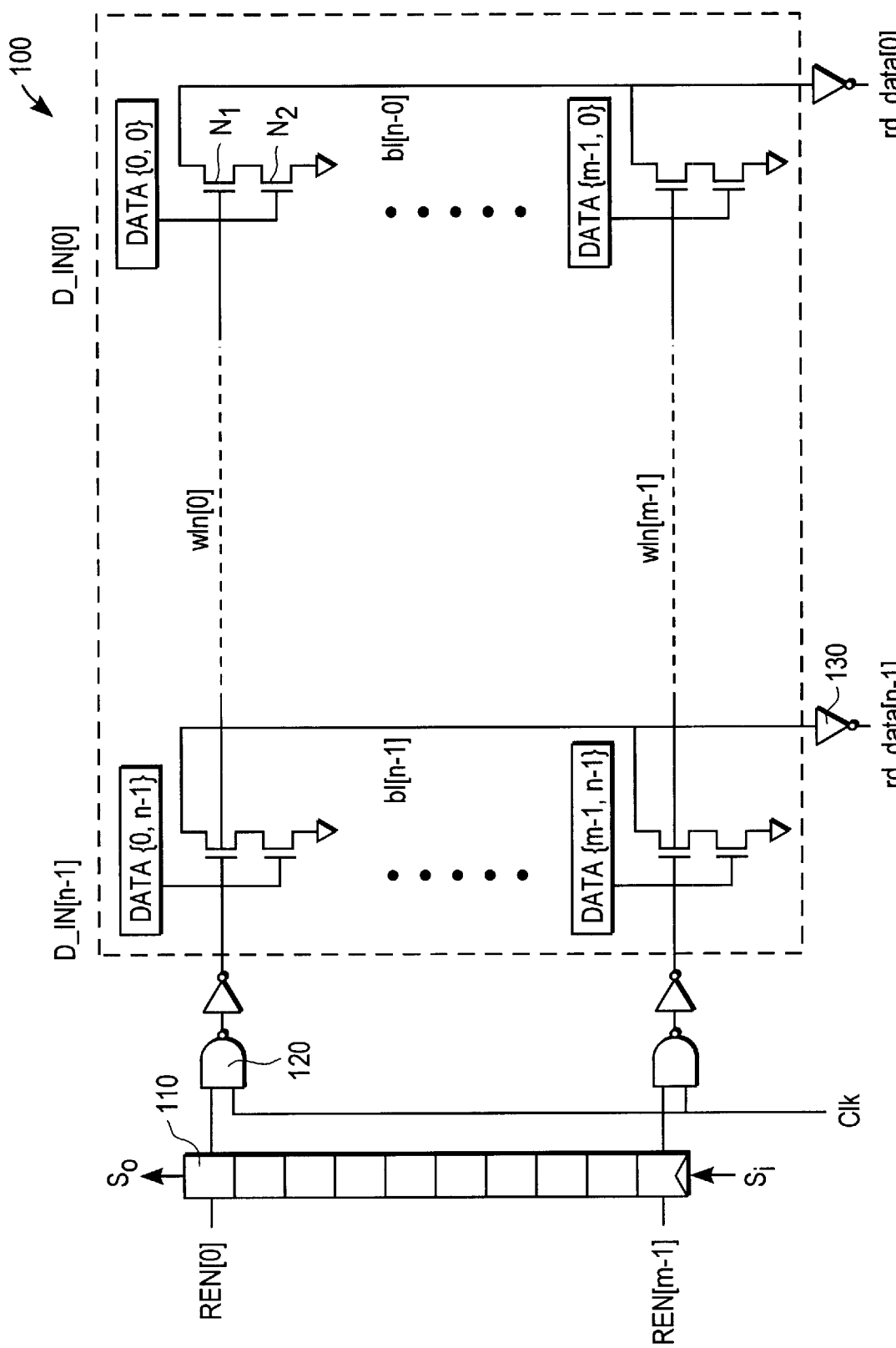
FIG. 1 is a block diagram of a prior art register array.
Figures 2A, 2B:
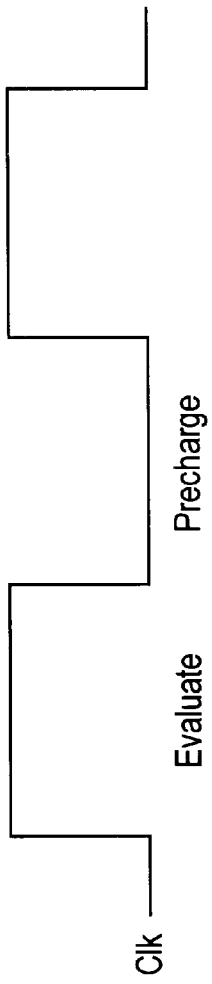
FIG. 2A is a plot of a clock signal CLK.
FIG. 2B is a truth table for the register array of FIG. 1.
Figure 3:
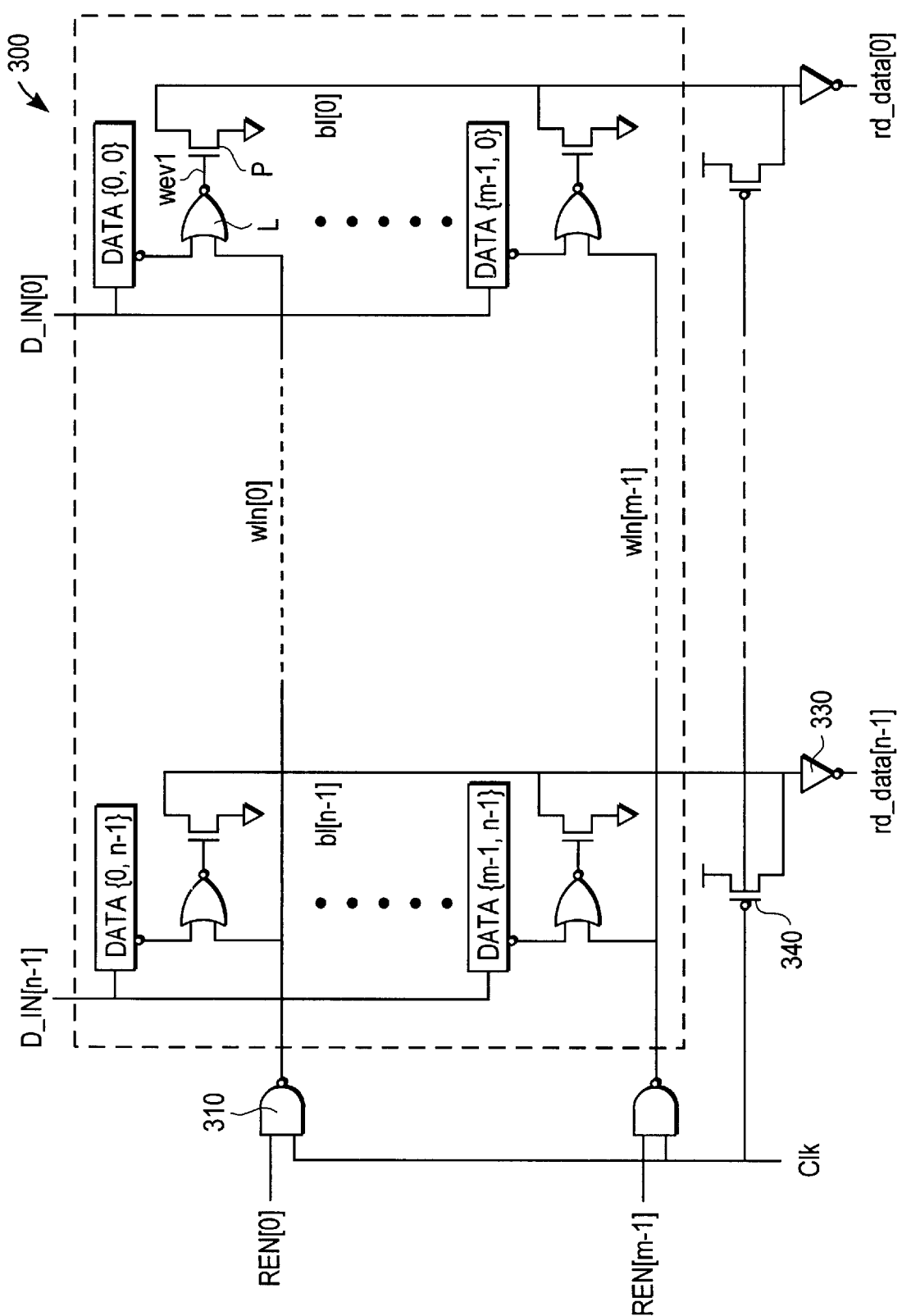
FIG. 3 is a block diagram of a register array in accordance with the present invention.

FIG. 3 is a block diagram of an embodiment of a register array system 300 in accordance with the present invention. Referring to FIG. 3, the register array system 300 comprises an array of m rows by n columns of data registers, m read word lines, wln[0], wln[1], . . . , and wln[n], each corresponding to one of the m rows of data registers, and n read bit lines, bl[0], bl[1], . . . , and bl[n], each corresponding to one of the n columns of data registers, where m and n are positive integers. The register array 300 also comprises m logic gates 310, each logic gate 310 corresponding to one of the m read word lines, receiving as inputs a clock signal CLK and one of m read enable signals REN[0], REN[1], . . . , and REN[m−1], and outputting to the read word line. The register array 300 further comprises m×n logic devices L and m×n pull down devices P, each logic device L and each pull down device P corresponding to a data register.

In one embodiment of the present invention, the pull down device P corresponding to each data register in a column of data registers is configured to discharge, when turned on, the read bit line corresponding to the column of data registers. Each logic gate 310 corresponding to a row of data registers and each logic device L corresponding to one data register in the row of data registers are configured so that the pull down device corresponding to the one data register is only turned on by the output of the second logic device in response to the clock signal, the read enable signal for the row of data registers, and the data stored in the one data register each having a high value. Otherwise, the pull down device corresponding to the one data register remains turned off.

In one embodiment of the present invention, each pull-down device P is implemented by a NFET, each logic gates 310 by a NAND gate, and each logic device L by a NOR gate, as illustrated in FIG. 3. The NOR gate L corresponding to a data register in a row of data registers receives as input the compliment of the data value in the data register and the output of the NAND gate 310 corresponding to the row of data registers. Each NFET P comprises a first diffusion region, a second diffusion region, and a gate. For the NFET P corresponding to a data register in a column of data registers, the gate of the NFET P is coupled to the output of the NOR gate corresponding to the data register, the first diffusion region of the NFET P is connected to the read bit line corresponding to the column of data registers, and the second diffusion region connected to a low voltage source $V_{SS}$ or the ground. Since each read word line is coupled to the CLK signal and a read enable signal REN[i] through a NAND gate 310, where i=0, 1, . . . , m, the read word line will have a low value when both CLK and REN[i] are high, and will have a high value otherwise. The output of a NOR gate corresponding to a data register will be high only if the corresponding read word line is low and the complement of the data value in the corresponding data register is low. This results in the gate of each NFET P being driven high only if the CLK, the corresponding read enable signal and the data value in the corresponding data register are all high. For all other conditions, the gate of the NFET will be low, such that it remains turned off.

The register array 300 also comprises n output inverters 330. Each of the n read bit lines is coupled to one of the n output inverters 330, and is read through the output inverter 330.

The register array 300 further comprises n PFET devices 340 for precharging one of the n read bit lines. In one embodiment of the present invention, each of the n precharging switches 340 is a NFET having a gate, a first diffusion region and a second diffusion region, and having its gate voltage regulated by the compliment of the CLK signal, its first diffusion region connected to $V_{DD}$, and its second diffusion region to a corresponding read bit line. Thus, the precharging switches 340 will turn on when the CLK is low, connecting the bit lines to $V_{DD}$.

FIG. 4 is a truth table for the register array 300, where wevl[i], i=0, 1, . . . , m, represents the gate voltage of a NFET P corresponding to a data register on the read word line wln[i], and $rd_{13}$ data[i] represents the output of the output inverter 330 coupled to the read bit line bl[i]. Referring to FIG. 3 and FIG. 4, in a normal mode of operation, during a precharge phase, the CLK is low, resulting in the NFET's 340 being turned on and all of the pull down devices P being turned off, so each read bit line is precharged to $V_{DD}$. During an evaluate phase, the CLK is high, and a read word line is selected or has a low voltage value if the corresponding read enable signal is high. A read word line is not selected or has a high value if the corresponding read enable signal is low. When the read word line corresponding to a row of data registers is not selected, the gate voltage of any NFET pull-down device P corresponding the data register in the row of data registers will be low, and all NFET's P corresponding to the row of data registers will be turned off. When a read word line corresponding to a row of data registers is selected and the data value in one of the row of data registers is low, the gate voltage wevl of the corresponding NFET pull down device P is low so that the NFET P is turned off. When a read word line is selected and the data value in a data register on the read word line is high, the gate voltage wevl of the corresponding NFET pull-down device P is high so that the NFET P is turned on and the corresponding read bit line is discharged through the NFET P to $V_{SS}$ or ground.

The register array of FIG. 3 substantially eliminates the problem of charge sharing in a multi-hot condition. In the present invention, there is not a significant change in the capacitance of a read bit line during the precharging phase and during the evaluate phase in a multi-hot condition. In the precharging phase, all of the pull down devices P are turned off, and the capacitance of a bit line is the sum of the diffusion capacitances of the pull down devices P along the bit line, plus other parasitic capacitances. In a multi-hot condition during the evaluate phase, if more than one read enable signal is high and the corresponding data registers along a bit line all store a low data value, the corresponding NFET pull down devices P are turned off. The other NFET's P along the read bit line are also turned off because the corresponding read word lines are not selected. Therefore, the capacitance of the read bit line in the multi-hot condition is also the sum of the diffusion capacitances of the pull down devices P along the bit line, plus other parasitic capacitances.

Additionally, the register array of FIG. 3 reduces the read bit line capacitance. In contrast to the conventional register array 100, in the register array 300 of the present invention, a single pull-down device P is used to discharge a read bit line in response to a read enable signal and a data register value being high. The size of the pull down device P can thus be half of the size of the NFET $N_1$ or $N_2$ in the conventional register array 100, in order to maintain the same drive strength. The diffusion capacitance associated with the pull-down device P is half of the diffusion capacitance associated with the NFET N2 if the pull-down device P is half the size of the NFET $N_2$. This will reduce the read bit line capacitance and improves the speed of a read operation.

Furthermore, the register array of FIG. 3 is robust to the noise margin on the read word lines. In the present invention, each read word line is coupled to a static logic gate L instead of a dynamic pull down gate, such as the NFET $N_1$ in the conventional register array 100. This permits the read word lines to tolerate more noise, so that the read word lines may be operated unshielded, thereby permitting a reduction in the size of the register array.

Figure 6:
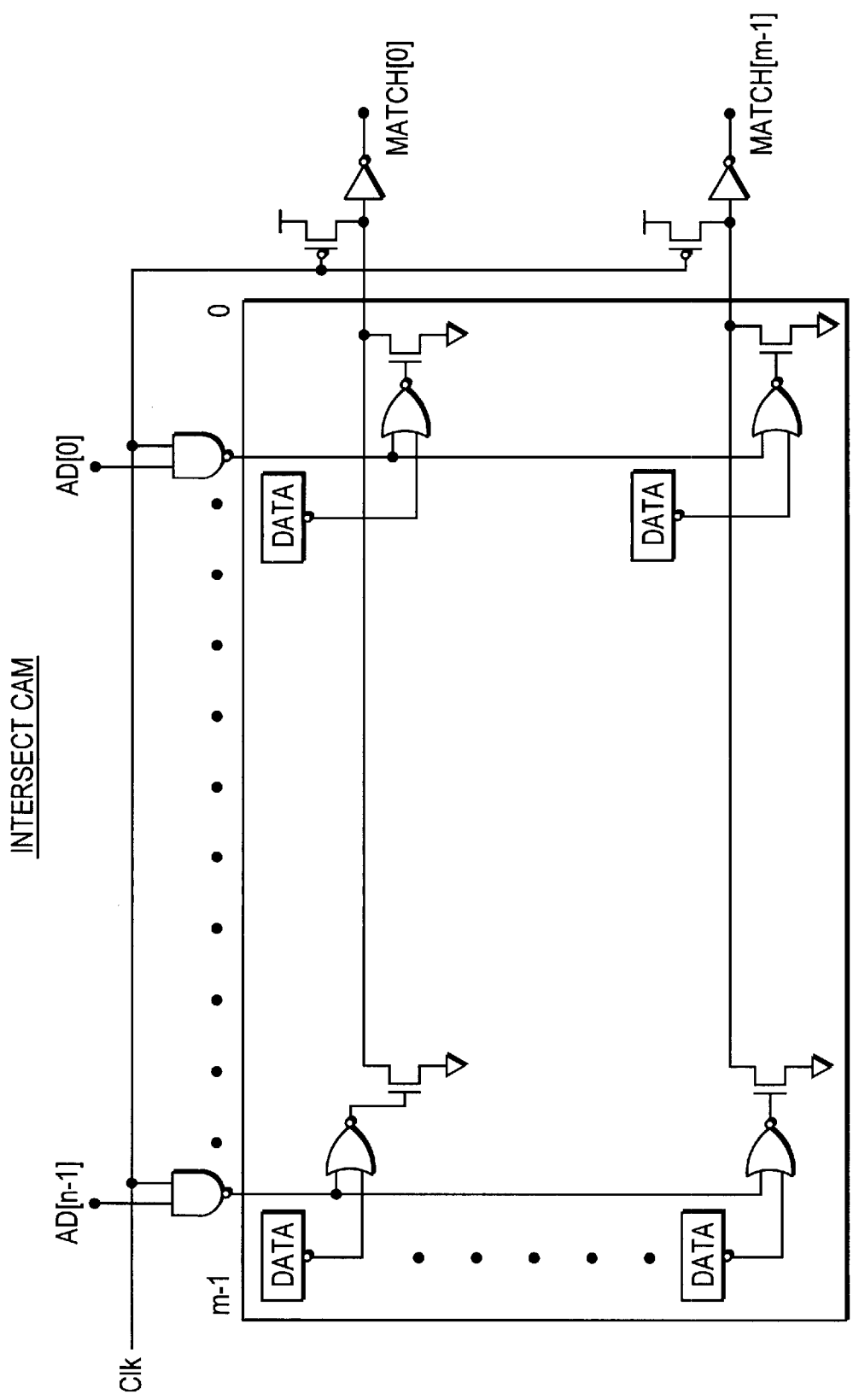
FIG. 6 is block diagram of a content addressable memory.

It should be noted that the present invention may be applied to a content addressable memory (CAM). In a CAM, a data item is stored as a tag and a value. A data pattern is given to the tag section of the CAM. The data pattern is matched with the content of the tag section. If an item in the tag section of the CAM matches the supplied data pattern, the CAM outputs the value associated with the matched tag. FIG. 6 shows a portion of a CAM embodiment that does not have an associated RAM, although it could in general. In this embodiment as an intersect CAM the data pattern is stored in the data registers of the register array. An incoming tag is compared with the stored data pattern. If any of the incoming tag bits and a corresponding bit in the stored data pattern is a 1, then a 'hit' is indicated on the corresponding row. Although a preferred implementation for the logic device L may include a NOR gate, other logically equivalent combination of logic gates may also be used to implement the logical function for controlling the pull down devices. In particular, it is known in the art that the function of a NOR gate may be implemented using a combination of other logic gates, such as NAND gates, in conventional manner.

Figure 5:
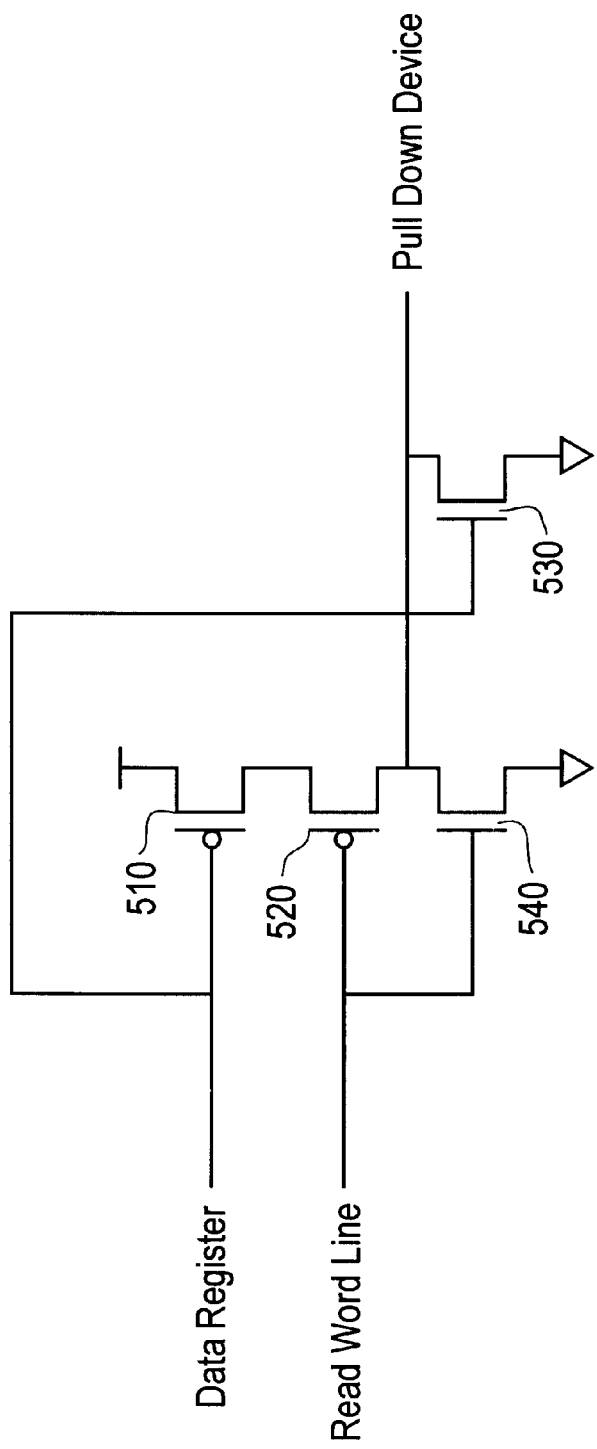
FIG. 5 is an embodiment of a NOR gate in the register array of FIG. 3.

FIG. 5 is a circuit diagram of a transistor representation of a NOR gate and includes a combination of P-type field-effect transistors (PFET) and NFET's that implements the logic device L, in accordance with an alternative embodiment of the present invention. Referring to FIG. 5, in an alternative embodiment of the present invention, the logic device P comprises a first PFET 510, a second PFET 520, a first NFET 530 and a second NFET 540, each having a gate, a first diffusion region, and a second diffusion region. The gate voltage of the first PFET 510 and the gate voltage of the first NFET 530 are both regulated by the compliment of the data value in the corresponding data registers. The gate voltage of the second PFET 520 and the gate voltage of the second NFET 540 are the same as the voltage on the corresponding read word line. The first diffusion region of the first PFET 510 is coupled to $V_{DD}$, and the second diffusion region of the first PFET 510 is coupled to the first diffusion region of the second PFET 520, which second diffusion region is in turn coupled to the first diffusion regions of both the first NFET 530 and the second NFET 540, and to the gate of the corresponding pull down device P. The second diffusion regions of both the first NFET 530 and the second NFET 540 is connected to $V_{SS}$, or the ground.

When the corresponding word line is selected (the voltage on the word line is low), and the data value in the corresponding data register is high, or the compliment of the data value is low, both the first PFET 510 and the second PFET 520 are turned on, and both the first NFET 530 and the second NFET 540 are turned off, so the gate of the corresponding pull down device P is connected to $V_{DD}$ through the two PFET's 510 and 520. If either the corresponding word line is not selected or the data value in the corresponding data register is low, at least one of the two PFET's 510 and at least one of the two NFET's is turned on, resulting in gate of the corresponding pull-down device P being connected to $V_{SS}$, or the ground. Therefore, this combination of the PFET's and NFET's performs the same logic function as a NOR gate.

We claim:

1. In a register array system comprising at least one column of data registers, each data register for storing a data value, a read bit line corresponding to each column of data registers, and a pull down device corresponding to each data register and configured to discharge, in response to being turned on, the read bit line corresponding to the same data register, a method for reading the data value stored in a data registers, comprising:

providing a clock signal and a read enable signal;

in response to the clock signal having a low value, precharging the corresponding read bit line to a voltage $V_{DD}$;

in response to the clock signal, the read enable signal, and the data value each having a high value, turning on the pull down device to discharge the corresponding read bit line;

in response to the clock signal having a low value, turning off the pull down device;

in response to the read enable signal having a low value, turning off the pull down device; and in response to the data value being low, turning off the pull down device.

2. The method of claim 1, wherein the pull down device corresponding to a data register is a field effect transistor having a gate voltage controlled by a combination of devices coupled to the data register and receiving as a first input the clock signal and as a second input the read enable signal.

3. The method of claim 2, wherein the combination of devices performs a logic function comprising in response to the clock signal, the read enable signal, and the data value stored in the data register each having a high value, outputting a first voltage to turn on the field-effect transistor;

in response to the clock signal having a low value, outputting a second voltage to turn off the field-effect transistor;

in response to the read enable signal having a low value, outputting a second voltage to turn off the field-effect transistor; and in response to the data register having a low data value, outputting a second voltage to turn off the field-effect transistor.

4. The method of claim 2, wherein the combination of devices comprises a NAND gate receiving the clock signal and the read enable signal as inputs, and a NOR gate having its first input coupled to the output of the NAND gate, receiving as its second input the compliment of the data value stored in the data register, and outputting to the gate of the pull down device.

5. A register array system, comprising:

at first number of rows by a second number of columns of data registers, each data register configured to store a data value;

a read bit line corresponding to each column of data registers;

a first logic device corresponding to each row of data registers and receiving as inputs a clock signal and a read enable signal for the row of data registers;

a read word line corresponding to each row of data registers and connected to an output of the first logic device corresponding to the row of data registers;

a second logic device corresponding to each data register and having a first input coupled to the data register and a second input connected to the read word line corresponding to the row of data registers including the data register; and a pull-down device corresponding to each data register, and configured to discharge the bit line corresponding to the column of data registers including the data register in response to being turned on by an output of the first logic device corresponding to the data register.

6. The register array system of claim 5, wherein the first logic device performs a first logic function comprising:

in response to both the received clock signal and read enable signal having a high value, outputting a third voltage; and in response to the received clock signal having a low value, outputting a forth voltage; and in response to the received read enable signal having a low value, outputting a forth voltage.

7. The register array system of claim 5, wherein the second logic device corresponding to a data register and connected to the word line corresponding to the row of data registers including the data register performs a second logic function comprising:

in response to the data register having a high data value and the read word line having a third voltage value, outputting a first voltage;

in response to the data register having a low data value, outputting a second voltage; and in response to the read word line having a forth voltage value, outputting a second voltage.

8. The register array system of claim 5, wherein the first logic device is a NAND gate.

9. The register array system of claim 5, wherein the second logic device is a NOR gate receiving as a first input the compliment of the data value stored in the data register coupled to the first input of the second logic device.

10. The register array system in claim 5, wherein the pull down device corresponding to a data register is a N-type field effect transistor having a gate, a first diffusion region, and a second diffusion region, the gate being coupled to an output of the second logic device corresponding to the data register, the first diffusion region being connected to a bit line and the second diffusion region being connected to a voltage $V_{SS}$.

11. The register array system in claim 5, wherein the second logic device corresponding to a data register comprises:

a first P-type field effect transistor having a gate, a first diffusion region and a second diffusion region, the gate receiving the compliment of the data value stored in the data register, and the first diffusion region being connected to a voltage $V_{DD}$;

a second P-type field effect transistor having a gate, a first diffusion region and a second diffusion region, the gate being connected to the word line corresponding to the row of data registers including the data register, and the first diffusion region being connected to the second diffusion region of the first P-type field effect transistor;

a first N-type field effect transistor having a gate, a first diffusion region and a second diffusion region, the gate being connected to the gate of the first P-type field effect transistor, the first diffusion region being connected to the second diffusion region of the second P-type field effect transistor and to the pull down device corresponding to the data register, and the second diffusion region being connected to a voltage $V_{SS}$; and a second N-type field effect transistor having a gate, a first diffusion region and a second diffusion region, the gate being connected to the gate of the second P-type field effect transistor, the first diffusion region being connected to the second diffusion region of the second P-type field effect transistor and to the pull down device corresponding to the data register, and the second diffusion region being connected to the voltage $V_{SS}$.

* * * * *

UNITED STATES PATENT AND TRADEMARK OFFICE
CERTIFICATE OF CORRECTION

PATENT NO. : 6,542,423 B1
DATED : April 1, 2003
INVENTOR(S) : Vydhyanathan Kalyanasundharam and Ajay Naini It is certified that error appears in the above-identified patent and that said Letters Patent is hereby corrected as shown below:

<u>Title page,</u>
Item [57], ABSTRACT,
Line 2, delete "read line" and insert -- read word line --.

Signed and Sealed this

Twelfth Day of August, 2003

JAMES E. ROGAN
*Director of the United States Patent and Trademark Office*